United States Patent [19]

Krohn et al.

[11] Patent Number: 4,679,029
[45] Date of Patent: Jul. 7, 1987

[54] OPTOELECTRONIC ROTATIONAL POSITION SENSOR

[75] Inventors: David A. Krohn, Hamden; David R. Maack, Madison; Edmond I. Vinarub, Cheshire; John R. Ellison, Jr., Bethany, all of Conn.

[73] Assignee: Eotec Corporation, West Haven, Conn.

[21] Appl. No.: 647,031

[22] Filed: Sep. 4, 1984

[51] Int. Cl.⁴ .................................. H03K 13/02
[52] U.S. Cl. ........................ 340/347 P; 250/231 R; 73/1 C; 73/862.23; 73/862.26
[58] Field of Search ............... 73/862.23, 862.26, 1 C; 250/231 R, 231 P, 231 SE; 340/347 P

[56] References Cited

U.S. PATENT DOCUMENTS

| | | | |
|---|---|---|---|
| 2,586,540 | 2/1952 | Holden | 250/231 R |
| 3,577,000 | 5/1971 | Warner | 250/231 SE |
| 3,940,609 | 2/1976 | Johnstun | 250/231 SE |
| 4,083,254 | 4/1978 | Nissl | 250/231 R |
| 4,320,293 | 3/1982 | Guretzky | 250/231 SE |
| 4,500,870 | 9/1981 | Krohn et al. | 340/347 P |
| 4,558,601 | 12/1985 | Stasiek et al. | 73/862.23 |

Primary Examiner—Bernard Roskoski
Attorney, Agent, or Firm—Darby & Darby

[57] ABSTRACT

An apparatus is disclosed for sensing rotational or angular position of a shaft. The apparatus incorporates two light transmission paths, each having a separate photodetector providing an electrical signal in response to the intensity of received light. The electrical signals from the photodetectors are differentially processed to obtain a signal representative of rotational position. Devices are provided in each of the light transmission paths to vary the intensity of light transmitted in the path, and these devices are mechanically coupled to the shaft so that the variations in the respective light paths are opposite. The differentially processed photodetector signals are therefore unaffected by the absolute position of the shaft but are responsive only to deviations from a reference position. Futhermore, this differentially processed signal exhibits a higher degree of linearity was heretofor obtainable. Various embodiments are disclosed for achieving this opposite variation in the respective light paths. Preferably, the angular position sensor is utilized in a torque wrench or similar device for sensing applied torque.

8 Claims, 6 Drawing Figures

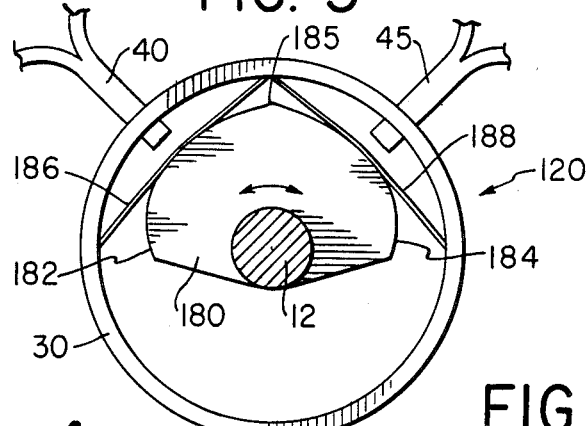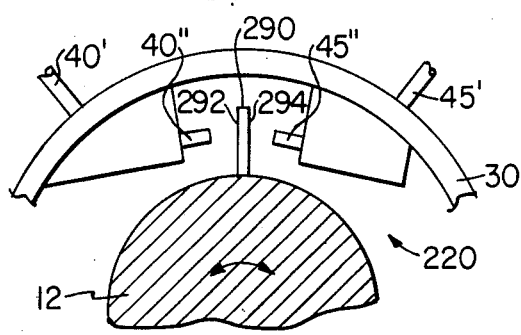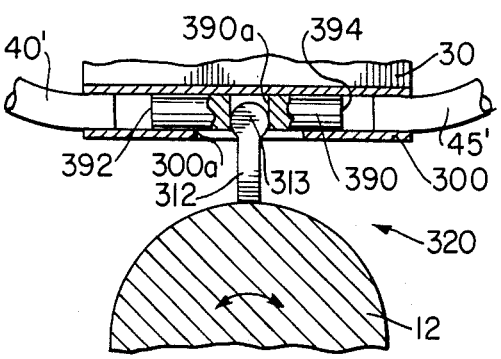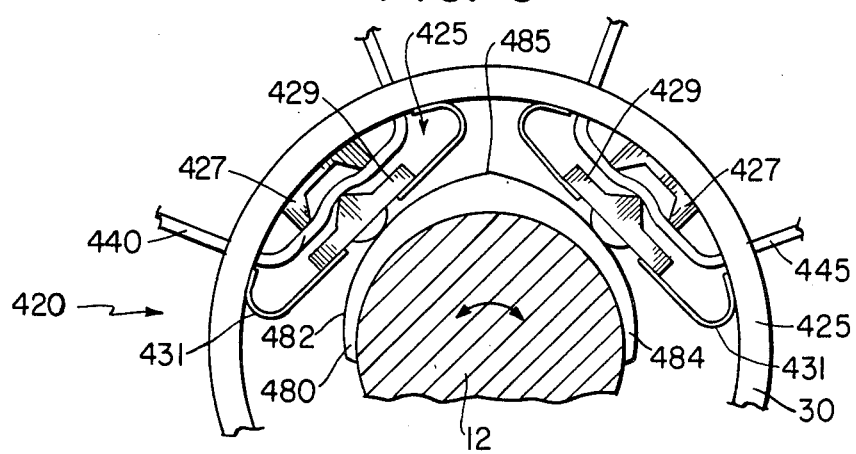

OPTOELECTRONIC ROTATIONAL POSITION SENSOR

The present invention relates generally to sensing rotational position of a shaft, or the like, by optoelectronic means and, more particularly, concerns an optoelectronic device which can provide precision measurement of small deviations in the rotational position of a shaft from a nominal orientation. Such devices find application, for example, in torque sensors.

In copending U.S. patent application, Ser. No. 306,901, filed on Sept. 29, 1981, which is assigned to the assignee of the present patent application, there is disclosed an optoelectronic sensor for the angular or rotational position of a shaft. The sensor works in association with a light transmitter and a light receiver which are mounted in fixed positions. An element is mounted on the shaft for rotation therewith and includes a light reflecting track, a portion of which provides a light reflecting surface that completes the light transmission path between the transmitter and receiver. The track is constructed and positioned on the element so that, as the element rotates, the portion of the track within the light transmission path assumes a predefined sequence of positions, each of which is at a different distance from the transmitter and/or the receiver. Each different angular position of the shaft therefore establishes a light transmission path of a different length and produces a different level of light intensity at the receiver. By detecting the level of light intensity at the receiver, it is therefore possible to establish the rotational position of the shaft.

The angular position sensor of patent application Ser. No. 306,901 was disclosed in association with sensing the position of a shaft in a utility meter. In this application, it was necessary to resolve ten angular ranges (corresponding to the digits "0" through "9") as the shaft rotated a full 360 degrees. In such an application, the angular position sensor of the patent application exhibited satisfactory linearity and resolution and therefore provided excellent performance.

However, there are some applications in which angular position of a shaft must be detected precisely over very small angles of rotation. For example, torque sensors may employ a shaft of known torsional characteristics which is anchored at one end and has the torque to be determined applied at the free end. The relative angular or rotational displacement between the two ends of the shaft is then measured to determine the value of the applied torque. This application requires detection of very small angular displacements with a high degree of precision and, therefore, linearity.

A number of problems are encountered when it is attempted to apply the angular position sensor of the above-identified patent application in a device requiring precision determination of small angular displacement. First of all, it is found that small angular displacements produce changes in detected light intensity which are very small in comparison to the absolute intensity of light and are therefore difficult to detect accurately. In addition, although the slight non-linearity which may be present in the sensor does not affect accuracy significantly when relatively large angular displacements were involved, it represents a source of substantial error, when it is desirable to detect small changes in angular position.

It is an object of the present invention to detect very small angular displacements of a shaft with a high degree of precision.

It is another object of the present invention to provide a high precision optoelectronic rotational position sensor which achieves a high degree of linearity and high precision with very small angular displacements. It is also an object of the present invention to provide an optoelectronic torque sensor exhibiting the same characteristics.

It is a further object of the present invention to provide an angular position sensor which is simple and relatively inexpensive in construction, yet accurate, reliable and convenient in use.

In accordance with the present invention, an apparatus for sensing rotational or angular position of a shaft incorporates two light transmission paths, each having a separate photodetector providing an electrical signal in response to received light. The electrical signals from the photodetectors are differentially processed to obtain a signal representative of rotational position. Devices are provided in each of the light transmission paths to vary the light transmitted in the path, and these devices are mechanically coupled to the shaft so that the variations in the respective light paths are opposite. The differentially processed photodetector signals are therefore unaffected by the absolute position of the shaft but are responsive only to deviations from a reference position. Futhermore, this differentially processed signal exhibits a higher degree of linearity than was heretofor obtainable. Various embodiments are disclosed for achieving this opposite variation in the respective light paths. The disclosed embodiments utilize the angular position sensor in a torque device for sensing applied torque.

The foregoing brief description, as well as further objects, features and advantages of the present invention will be more completely understood from the following detailed description of presently preferred, but nonetheless illustrative, embodiments of the invention, with reference being had to the accompanying drawing, in which:

FIG. 3 is a fragmentary view, similar to FIG. 2, illustrating an alternative embodiment of the angular position sensor;

FIG. 4 is a fragmentary view, on an enlarged scale, similar to FIG. 3, illustrating a further embodiment of the position sensor;

FIG. 5 is a fragmentary view, similar to FIG. 4, illustrating yet another embodiment of the angular position sensor; and FIG. 6 is a fragmentary view, similar to FIGS. 4 and 5, illustrating a further embodiment of the angular position sensor.

DETAILED DESCRIPTION

Figure 2:
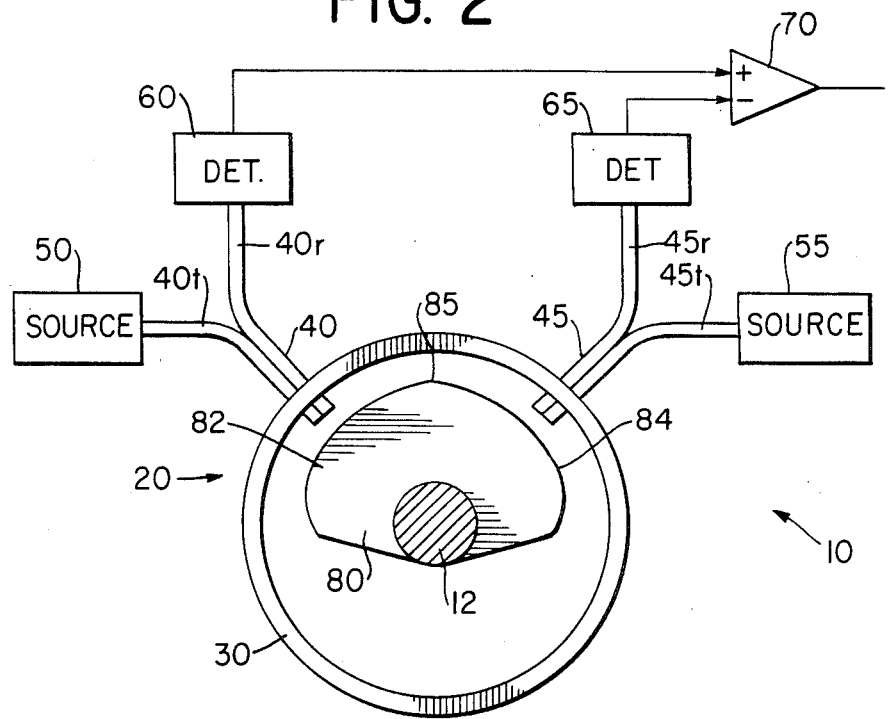
FIG. 2 is a sectional view taken along line 2—2 in FIG. 1, and further illustrates in block diagram form, the additional components utilized in conjunction with the invention.
Figure 1:
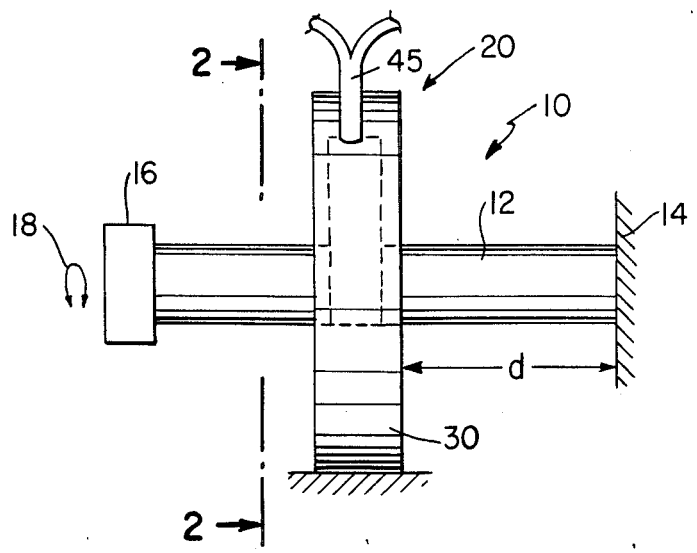
FIG. 1 is a schematic representation of a torque sensing apparatus incorporating the present invention.

Referring now to FIGS. 1 and 2, there is illustrated an optoelectronic torque sensor 10 embodying objects and features of the present invention. The torque sensor broadly comprises: a shaft 12 having one end affixed against rotation to a surface 14, the opposite, free end of the shaft bearing a torque application head 16; and an optoelectronic rotational position sensor 20 mounted in a fixed position with respect to the surface 14.

In a typical application, torque sensor 10 could form part of a strength member experiencing torque. Shaft 12 has a predetermined torsional characteristic and a predetermined length, so that a known relationship exists between the torque applied through the shaft to the head 16 and the rotational displacement (represented by the double-headed arrow 18) of the head 16 with respect to the surface 14. Shaft position encoder 20 provides an indication of this relative rotation, since it is fixedly mounted with respect to surface 14 at a predetermined distance, d, therefrom.

The optoelectronic torque sensor 20 includes a housing 30 which is mounted over a portion of the shaft 12 in a fixed relationship to the surface 14. Fiber optic transmit/receive structures 40,45 are mounted in predetermined, fixed positions on the housing 30 and extend therethrough to the interior thereof. The fiber optic structures 40,45 are Y-shaped to provide a transmit branch ($40_t$, $45_t$) and a receive branch ($40_r$, $45_r$). Although the transmit braches $40_t$, $45_t$ are shown as connected to separate light sources 50,55, those skilled in the art will appreciate that they could just as well be connected to a common source. The receiving branches $40_r$, $45_r$ are each connected to a respective photodetector or light sensor 60,65. Each photodetector preferably responds to the light received from its respective receiving branch by producing an electrical signal proportional to the intensity of the received light. The electrical output signals of the photodetectors 60,65 are differently processed by amplification circuitry 70 to provide an output signal representative of the rotational position of shaft 12.

Light sources 50,55 and photodetectors 60,65 may be any conventional devices of the type described, although it is preferred that they operate in the infrared range of the light spectrum. Amplification circuitry 70 is represented schematically as a differential amplifier. It will be understood, however, that amplification circuitry 70 includes conventional circuits, for example, for biasing, noise filtering, proper interfacing, offset control and gain adjustment, all of which are so well known as not to require further discussion herein.

FIG. 2 illustrates one preferred embodiment of the optoelectronic rotational position sensor 20. In this embodiment, a cam element 80 is mounted on the portion of the shaft 12 which extends within the housing 30. The cam element is fixed to the shaft 12 for rotation therewith, and includes a light-reflective track along its peripheral edge, comprising the track components 82,84, which intersect at a nominal reference position 85. The peripheral contours of track components 82,84 are mirror images of each other, so the cam 80 is symmetrical about an axis of symmetry intersecting the reference point 85 and the rotational axis of shaft 12. In the preferred embodiment, each track component 82,84 advances towards the axis of shaft 12 as the rotational displacement from reference point 85 increases. In addition, the fiber optic structures 40,45 are mounted so that their innermost ends are at a fixed, predetermined distance from the axis of shaft 12.

In practice, sources 50 and 55 would be closely matched in intensity and detectors 60 and 65 would be closely matched in sensitivity. The outputs of the detectors 60,65 would then be essentially equal if light of equal intensity were present in the receive branches $40_r$, $45_r$. Any slight mismatch between the outputs of the detectors could be compensated for by a slight adjustment of amplification circuitry 70 to produce a null output under these circumstances.

With cam 80 positioned as shown in FIG. 2 (i.e., with reference position 85 equidistance between the ends of fiber optics 40 and 45, the distance between the end fiber optic 40 and track component 82 is equal to the distance between the end of fiber optic 45 and track component 84. By design, the length of the light transmission path from source 50 to detector 60 (i.e., via branch $40_t$, track component 82 and branch $40_r$) is equal to the length of the light transmission path from source 55 to detector 65 (i.e., via branch $45_t$, track component 84 and branch $45_r$). Inasmuch as sources 50, 55 and detectors 60,65 are matched, a null is produced at the output of amplification circuitry 70 under these conditions.

Should cam element 80 be rotated clockwise with respect to the position shown in FIG. 2, track component 82 would move closer to the innermost end of fiber optic 40 and track component 84 would recede from the innermost end of fiber optic 45. This results in a shortening of the light transmission path between source 50 and detector 60, and a corresponding lengthening of the light transmission path between source 55 and detector 65. As a consequence, the output of detector 60 increases and the output of detector 65 exhibits a corresponding decrease, with the output of amplification circuitry 70 becoming positive, as a result. Similarly, a counterclockwise rotation of cam element 80 causes an increase in the length of the transmission path between source 50 and detector 60, with a corresponding decrease in the length of the transmission path between source 55 and detector 65. The output of amplification circuitry 70 then becomes negative.

Those skilled in the art will appreciate that the shapes of track components 82 and 84 can be selected to produce any desired variation in the outputs of detectors 60, 65 with the rotational position of cam element 80. In the preferred embodiment, the shapes of track component 82 and 84 are selected to produce linear variation of the detector outputs with rotational position of cam element 80. Hence, the output of amplification circuitry 70 will always be proportional to the amount of rotation of cam element 80 away from the reference position illustrated in FIG. 2, and the polarity of the output signal will be positive for clockwise rotations and negative for counterclockwise rotations.

FIG. 3 illustrates an alternate embodiment 120 of optoelectronic rotational position sensor 20 of FIG. 2. Position sensor 120 includes a number of elements which are identical to those of position sensor 20. These elements are indicated by the same reference characters which are used in FIG. 2. Cam element 180 is nearly identical to cam element 80. The primary difference is that, although the track components 182 and 184 have the same shape as track components 82 and 84, they need not be light-reflective. Instead, track components 182, 184 each bear against a respective one of diaphragm elements 186, 188 which are light reflective sheets (e.g., metal foil or mylar). The diaphragm elements 186, 188 are mounted so as to be in tension when cam element 180 is in the position shown in FIG. 3. As cam element 180 rotates, diaphragm elements 186 and 188 are urged towards or permitted to recede away from their respective fiber optics, to permit variation of the length of the light transmission path therethrough, as previously discussed with respect to the embodiment of FIG. 2. Operation of sensor 120 is therefore substantially identical to the operation of position sensor 20.

FIG. 4 illustrates a further alternative embodiment 220 of position sensor 20 of FIG. 2. In this embodiment, a radially oriented plate 290 is mounted directly on shaft 12. The fiber optics 40, 45 include extensions 40', 45' which extend in close proximity to plate 290. Plate 290 incorporates light-reflecting surfaces 292, 294 directed respectively towards the extensions 40', 45'. The position of plate 290 shown in FIG. 4 is a null or reference position. In a manner similar to that described with respect to the previous embodiments, rotation of shaft 12 away from the null position results in an increase in the length of the light transmission path through one of the fiber optics 40, 45 and a corresponding decrease in the light transmission path length through the other fiber optic.

FIG. 5 illustrates an alternate form 320 of rotational position sensor 220 of FIG. 4. In this embodiment, fiber optic extensions 40', 45' are mounted at either end of an opaque tube 300. A plunger 390 having light reflecting surfaces 392 and 394 is mounted for sliding movement within tube 300, between fiber optic extensions 40' and 45'. An arm 312 is mounted to shaft 12 so as to project radially outwardly therefrom. Arm 312 projects through a slot 300a in the side of tube 300 and into a bore 390a in plunger 390, where it terminates in a spherical end 313. Spherical end 313 is received within bore 390a with sufficient clearance to permit it to rotate freely therein.

In operation, the rotational movement of shaft 12 is coupled via arm 312, as sliding movement of plunger 390. In the reference position shown in FIG. 5, plunger 390 is equidistant from extensions 40' and 45', whereby light transmission through fiber optic structures 40 and 45 is equal, and the ouput of amplification circuitry 70 is therefore a null condition. Rotation of shaft 12 causes a corresponding displacement of plunger 390 from the position shown in FIG. 5, whereby the distance between extension 40' and surface 392 is no longer equal to the distance between extension 45' and surface 394. Inasmuch as the length of light transmission paths through fiber optic structures 40 and 45 are then no longer equal, amplification circuitry 70 produces a signal related to the displacement of plunger 390 and, therefore, the rotational position of shaft 12.

FIG. 6 illustrates a further alternate embodiment 420 of rotational position sensor 20 of FIG. 1. In the present embodiment, fiber optic structure 40 is replaced by a fiber optic conduit 440 which is connected directly between source 50 and detector 60, and fiber optic structure 45 is replaced by fiber optic conduit 445 which is connected directly between source 55 and detector 65. Conduits 440 and 445 are each received in a microbending fixture 425, to be discussed in detail below.

Mounted on shaft 12 is a cam element 480 having the track components 482 and 484 and a nominal reference position 485. These elements are comparable to track components 82 and 84 and reference position 85, respectively, in FIG. 1. As shaft 12 is rotated, the track components 482, 484 act on their respective microbending fixtures 425, 425 to modify the light transmissivity of conduits 440 and 445, respectively. When shaft 12 is in the position shown in FIG. 6 the structure is calibrated to provide equal light transmission through conduits 440 and 445, which produces a null signal at the output of amplification circuity 70. Any rotational displacement of shaft 12 from the position shown in FIG. 6 will cause an increase in the actuation of one of the microbending fixtures and a corresponding decrease in the actuation of the other, whereby conduits 440 and 445 are no longer equally deformed and exhibit different light transmission properties. As a result, amplification circuitry 70 produces a signal representative of this imbalance and, therefore, the amount of displacement of shaft 12 from its reference position.

The microbending fixtures 425, 425 are identical and are represented schematically in FIG. 6. Each microbending fixture has a stationary jaw 427, illustrated as mounted to the interior housing 30, and a moveable jaw 429. For simplicity, each moveable jaw is illustratively represented as being mounted to the housing 30 by means of simple resilient springs 431, 431. In practice, a more precise mounting structure could be utilized, to ensure proper alignment of the jaws and better control of relative movement therebetween. Each of conduits 440, 445 is received between the stationary and moveable jaws of its respective microbending fixture 425. As a result, each conduit is deformed when the fixture is activated, and the degree of deformtion depends upon the distance between the jaws of the respective microbending fixture. For ease of illustration, the jaws of the microbending fixtures have been illustrated with a small number of teeth. In practice, each jaw would have a plurality of teeth, so that the conduits 440 and 445 would each have multiple bends therein. As is well known, the degree of light transmission through a conduit can be closely controlled by controlling the amount of bending produced by its respective microbending fixture. As will be appreciated from the preceding description of rotational position sensor 420, this feature is used to advantage in the present invention.

Although preferred forms of the invention have been shown for illustrative purposes, those skilled in the art will appreciate that many additions, modifications and substitutions are possible without departing from the scope and spirit of the invention as defined by the accompanying claims. For example, the invention has been illustrated in terms of embodiments which control and sense the quantity or intensity of light, but the invention is not so limited. The invention could also be embodied, for example, in apparatus which control and sense the wavelength of light.

What is claimed is:

1. Apparatus for sensing the rotational position of a shaft, comprising:
   light source means;
   first light detecting means for producing an electrical output signal in response to light received at a sensing portion thereof;
   second light detecting means for producing an electrical output signal in response to light received at a sensing portion thereof;
   circuit means differentially responsive to the output signals of said first and second light detecting means for producing a signal indicative of rotational position of said shaft;
   means for providing a first light transmission path between said light source means and said first light detecting means;
   means for providing a second light transmission path between said light source means and said second light detecting means; and means mechanically coupled to said shaft for varying the length of the paths of said first and second means for providing a light transmission path, the length of said first and second light transmission paths being varied in relationship to the rotational displacement of said shaft from a predetermined reference position so that one of said paths is lengthened while the other is shortened.

2. Apparatus in accordance with claim 1 wherein said first and second light detecting means are each responsive to the amount of light received at their respective sensing portions and said means for varying adjusts the amount of light transmitted.

3. Apparatus in accordance with claim 2 wherein:
each of said means for providing comprises a light reflecting surface positioned so that the respective light transmission path includes a reflection from said surface, and means mounting said surface for movement so as to selectively lengthen and shorten the respective light transmission path; and
said means for varying comprising means for mechanically coupling rotation of said shaft to each of said mounting means so that the respective light transmission path has a reference length when said shaft is in said reference position and so that rotational displacements of said shaft from said reference position produce opposite changes in the lengths of the respective light transmission paths.

4. Apparatus in accordance with claim 3 wherein said means for mechanically coupling comprises a cam member mounted for rotation with said shaft, said cam member having a pair of component surfaces positioned so that a portion of one is interposed in one of said light paths and a portion of the other is interposed in the other of said light paths, said component surfaces being constructed so as to have opposite movements with respect to their respective light paths as said shaft is rotated.

5. Apparatus in accordance with claim 4 wherein each of said reflecting surfaces is mounted on one of said component surfaces 6. Apparatus in accordance with claim 4 wherein each of said reflecting surfaces is a sheet of material supported in tension, each of said component surfaces bearing against a surface of a different sheet, which surface is opposite the reflecting surface.

7. Apparatus in accordance with claim 3 wherein said reflecting surfaces are mounted on oppositely directed surfaces of a supporting member mounted for movement along a path intersecting said surfaces, said coupling means acting to couple opposite rotations of said shaft as opposite movements along said path of movement of said supporting member.

8. In combination with a rotational position sensing apparatus in accordance with any one of claims 1–7
a shaft having first and second ends, the rotational position of which shaft is to be sensed, said shaft having a known length and predetermined torsional characteristics;
means for securing the first end of said shaft against rotation with respect to said apparatus, said apparatus being mounted to sense rotational position of said shaft at a predetermined distance from said first end; and
means for applying a torque to be measured at the second end of said shaft;
the rotational position sensed by said apparatus being a measure of the torque applied at said second end.

* * * * *